(12) United States Patent
Mati

(10) Patent No.: US 9,449,719 B2
(45) Date of Patent: Sep. 20, 2016

(54) SOLID-STATE STORAGE DEVICE INCLUDING A HIGH RESOLUTION ANALOG-TO-DIGITAL CONVERTER

(75) Inventor: Nicholas P. Mati, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 2328 days.

(21) Appl. No.: 12/339,842

(22) Filed: Dec. 19, 2008

(65) Prior Publication Data

US 2010/0162085 A1    Jun. 24, 2010

(51) Int. Cl.
| | |
|---|---|
| H03M 13/05 | (2006.01) |
| H03M 13/00 | (2006.01) |
| G11C 29/04 | (2006.01) |
| G06F 11/10 | (2006.01) |
| G11C 29/52 | (2006.01) |
| G11C 27/00 | (2006.01) |
| G11C 29/50 | (2006.01) |
| G11C 16/34 | (2006.01) |

(52) U.S. Cl.
CPC ............. *G11C 29/52* (2013.01); *G11C 27/005* (2013.01); *G11C 29/50* (2013.01); *G11C 16/3418* (2013.01); *G11C 2211/5641* (2013.01)

(58) Field of Classification Search
None
See application file for complete search history.

(56) References Cited

U.S. PATENT DOCUMENTS

| | | | |
|---|---|---|---|
| 4,884,075 A | 11/1989 | Mangelsdorf | 341/159 |
| 6,603,416 B2 | 8/2003 | Masenas et al. | 341/120 |
| 6,980,140 B1 | 12/2005 | Rowland et al. | 341/118 |
| 7,212,144 B1 | 5/2007 | Sutardja | 341/159 |
| 7,639,531 B2 * | 12/2009 | Cornwell et al. | 365/185.03 |
| 2005/0128118 A1 * | 6/2005 | Devendorf et al. | 341/158 |
| 2007/0011563 A1 | 1/2007 | Tsang | 714/758 |
| 2007/0171730 A1 * | 7/2007 | Ramamoorthy et al. | 365/185.33 |
| 2007/0263439 A1 | 11/2007 | Cornwell et al. | 365/185.03 |
| 2008/0307270 A1 * | 12/2008 | Li | 714/47 |
| 2009/0024905 A1 * | 1/2009 | Shalvi et al. | 714/773 |
| 2011/0215958 A1 * | 9/2011 | Rofougaran | 341/155 |

FOREIGN PATENT DOCUMENTS

WO    WO 2004/030217    4/2004

OTHER PUBLICATIONS

Maxim, Application Note 810, "Understanding Flash ADCs", Oct. 2, 2001.

Kuphaldt, T., "Lessons in Electrical Circuits, vol. IV—Digital," 4th Edition, Nov. 1, 2007.

(Continued)

*Primary Examiner* — Justin R Knapp
(74) *Attorney, Agent, or Firm* — Westman, Champlin & Koehler, P.A.

(57) ABSTRACT

A storage device includes a solid-state storage medium having a plurality of cells adapted to store data and an analog-to-digital converter (ADC) coupled to at least one cell of the plurality of cells. The ADC includes a first operating mode having a first number of quantization levels to determine a value stored in the at least one cell based on a number of possible values represented by the at least one cell. The ADC further includes a second operating mode having a second number of quantization levels to determine the value stored in the at least one cell, where the second number of quantization levels is greater than the first number of quantization levels. The ADC selectively enables the first or the second operating mode as a selected operating mode and determines a signal representative of the value stored in the at least one cell using the selected operating mode.

21 Claims, 4 Drawing Sheets

(56) References Cited

OTHER PUBLICATIONS

Maxim, MAX104, Datasheet for 8-bit ADC with On-Chip 2.2GHz Track/Hold Amplifier, Document 19-1459, Rev. 2, Mar. 2002.

Maxim, MAX1106/MAX1107, Datasheet for Single-Supply, Low-Power Serial 8-Bit ADCs, Document 19-1432, Rev. 0, Mar. 1999.

Texas Instruments, TM470PLF111 16/32-Bit RISC Flash Microcontroller, Datasheet, Oct. 2006.

\* cited by examiner

SOLID-STATE STORAGE DEVICE INCLUDING A HIGH RESOLUTION ANALOG-TO-DIGITAL CONVERTER

FIELD

The present invention relates generally to a solid-state storage device including a high resolution analog-to-digital converter (ADC), and more particularly, but not by limitation, to solid-state storage devices including a high resolution ADC coupled to the channel decoder, such as a disc drive channel decoder.

SUMMARY

Figure 1:
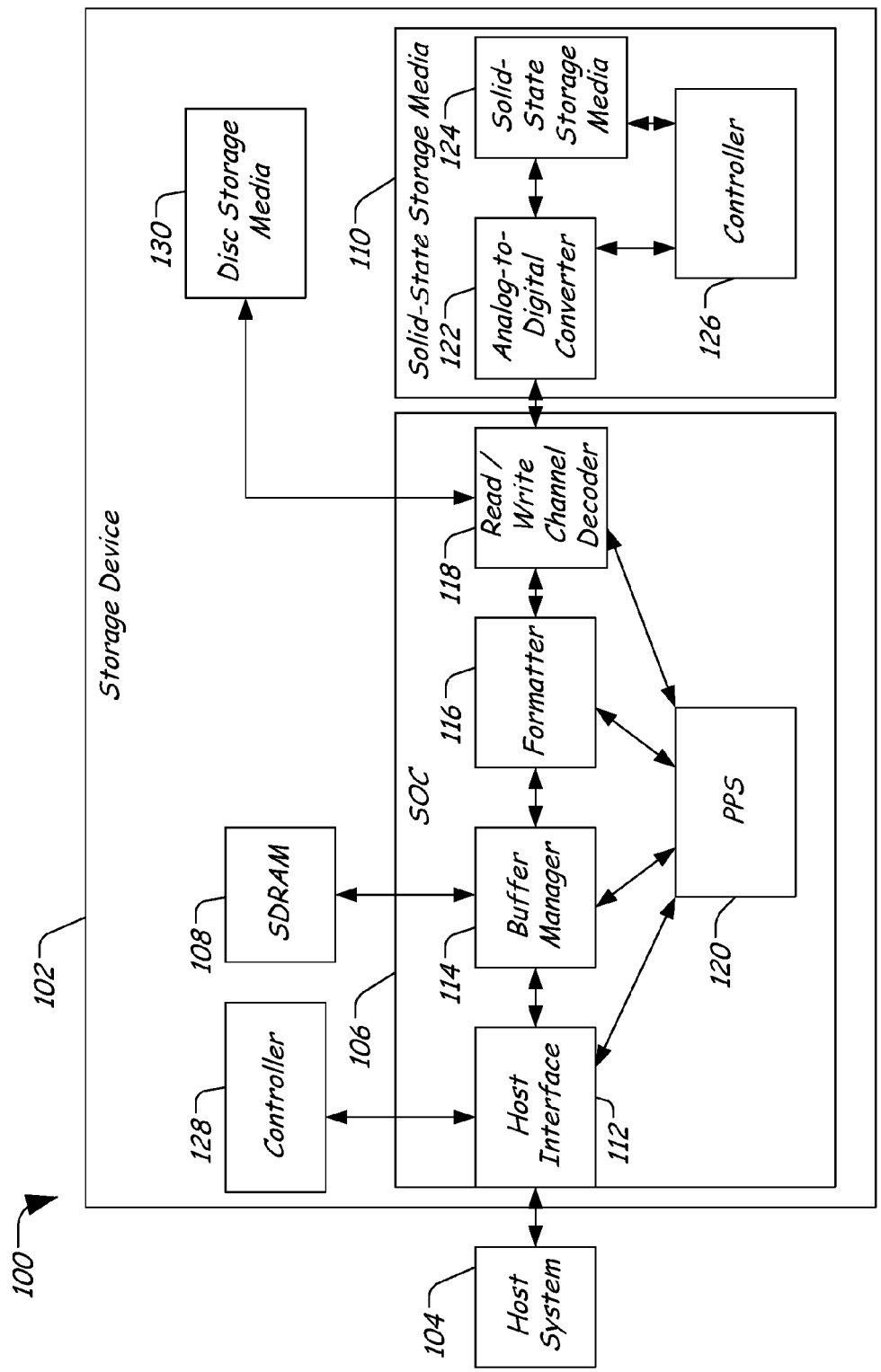
FIG. 1 is block diagram of a particular illustrative embodiment of a system including a storage device having a solid-state storage media with an analog-to-digital converter (ADC) coupled to a channel decoder.

A storage device is provided that includes a solid-state data storage medium including a plurality of cells adapted to represent data. The storage device further includes an analog-to-digital converter (ADC) coupled to at least one cell of the plurality of cells and adapted to quantize a value stored at the at least one cell to a signal that represents data values associated with the at least one cell. In a particular embodiment, the ADC is adapted to quantize a gate charge stored in the at least one cell. The ADC has a resolution (i.e., a number of quantization levels) that is greater than a number of bit values represented by the at least one cell.

DETAILED DESCRIPTION

Solid-state data storage circuits can exhibit data errors, such as data loss through charge leakage, data errors due to pattern sensitivity, data errors due to wear, other sources of data errors, or any combination thereof. While some vendors have added simple error correction code (ECC) features to improve reliability of solid-state data storage circuits, the solid-state data storage circuits can fail to provide the data integrity expected from a hard drive. In some cases, the solid-state data storage circuits utilize algorithms to mark pages as bad or unusable when such ECC features have trouble correcting errors within the data. Such marking of bad or unusable sectors can result in premature loss of overall storage capacity of the solid-state data storage circuit.

Single level cell (SLC) solid-state data storage media, such as an SLC flash memory chip, may use a single bit analog-to-digital converter (ADC) to infer and quantize a level of gate charge stored at each cell location being read (i.e., the ADC has a resolution (a number of quantized levels) that matches a number of bits represented by the particular cell). Since a single level cell has two possible values (e.g., a one or a zero), the ADC can have a resolution corresponding to two quantized levels to represent the two possible values. Multi-level cell (MLC) devices, which store two or more bits per cell, similarly infer and quantize a level of the gate charge using an ADC with resolution matching the number of discrete levels being programmed into the cell. In a particular example, in an MLC having two levels to represent two bits, the ADC has two-bit resolution to quantize to four levels. The ADC for both the SLC and MLC implementations is adapted to quantize the stored charge to fixed thresholds.

In a particular embodiment, a storage device is provided that includes a solid-state data storage medium including a plurality of cells adapted to represent data. The storage device further includes an analog-to-digital converter (ADC) coupled to at least one cell of the plurality of cells and adapted to quantize a value stored at the at least one cell to a signal that represents data values associated with the at least one cell. In a particular embodiment, the ADC is adapted to quantize a gate charge stored in the at least one cell. The ADC has a resolution (i.e., a number of quantization levels) that is greater than a number of bit values represented by the at least one cell. For example, if the at least one cell is a single level cell that has two possible values, the ADC may have a resolution that includes three or more quantization levels to quantize a value represented by the at least one cell. The storage device also includes an adaptive decoder coupled to the ADC and adapted to decode the signal to produce an output signal. In a particular example, the adaptive decoder can take advantage of the extra quantization levels to enhance accuracy in determining a data value represented by the at least one cell. In a particular embodiment, the solid-state data storage medium can be a flash memory, a magnetic random access memory (MRAM), other solid-state memory, or any combination thereof.

In another particular embodiment, the storage device can be a hybrid storage device that includes disc storage media and a solid-state storage medium that share a read/write channel, which includes a channel decoder. In this instance, the solid-state data storage media includes a high resolution analog-to-digital converter (ADC), which has a resolution (i.e., a number of quantization levels) that is greater than a number of possible bits values represented by a particular cell of the solid-state data storage media. In a particular example, the ADC may have a resolution that is two or more times the number of possible bit values represented by the particular cell. The ADC can provide a quantized value that represents data stored at the particular cell to the channel decoder, which can use the quantized value to determine a value of the data stored at the particular cell.

FIG. 1 is block diagram of a particular illustrative embodiment of a system 100 including a storage device 102 having a solid-state data storage media 110 with an analog-to-digital converter (ADC) 122 coupled to a read/write channel decoder 118. The storage device 102 is adapted to communicate with a host system 104, such as computing system, a personal digital assistant (PDA), a mobile telephone, a portable media player (adapted to play audio, video, text, or any combination thereof), another electronic device, or any combination thereof.

The storage device 102 includes a system on a chip (SOC) 106 coupled to the solid-state memory 110. The storage device 102 further includes a synchronous dynamic random access memory 108 coupled to the SOC 106, a controller 128 coupled to the SOC 106, and a disc storage media 130. In a particular embodiment, the disc storage media 130 can be omitted. In a particular embodiment, the controller 128 is adapted to control operation of the SOC 106.

The SOC 106 includes a host interface 112 that is responsive to the host system 104 to receive and communicate data. The SOC 106 further includes a buffer manager 114 that is responsive to the SDRAM 108 and that is coupled to the host interface 112 to buffer received data from the host system 104. The SOC 106 also includes a formatter 116 that is adapted to format the data appropriately for a destination storage media and/or to format the data for transmission to the host system 104 via the host interface 112. The SOC 106 further includes a read/write channel decoder 118 that is coupled to the solid-state memory 110 and to the disc storage media 130. In this particular example, the read/write channel decoder 118 can be an adaptive decoder, such as a Reed-Solomon decoder, an iterative decoder (e.g., a Soft-Output Viterbi Algorithm (SOVA) decoder, a low-density parity check (LDPC) decoder, another type of adaptive decoder, or any combination thereof. In a particular example, the adaptive decoder may be similar to decoders used in disc drive systems, which adaptive decoder may be used to decode data read from the disc storage media 130, from the solid-state memory 110, or any combination thereof. The SOC 106 may also include a pulsed power supply (PPS) 120 that is adapted to provide a power supply to the host interface 112, the buffer manager 114, the formatter 116, and the read/write channel decoder 118.

The solid-state memory 110 includes an analog-to-digital converter (ADC) 122, a solid-state storage media 124 coupled to the ADC 122, and a controller 126 that is adapted to control the ADC 122 and the solid-state storage media 124. In a particular embodiment, the solid-state memory 110 can be a flash memory, a magnetic random access memory (MRAM), another type of non-volatile solid-state memory, or any combination thereof. In a particular embodiment, the solid-state storage media 124 includes an array of memory cells (single layer or multi-layer cells), which are adapted to represent data values. Such solid-state storage media 124 can experience error disturbances that can be locally correlated between roughly adjacent cells within the flash array, for example. In a particular example, long-term memory retention loss may be caused by charge leakage from the floating storage gates of the solid-state storage media 124.

In a particular embodiment, to conserve power and to reduce chip size associated with the SOC 106 and the solid-state memory 110, the ADC 122 may have a first operating mode having a first number of quantization levels to determine a value stored in at least one cell of the solid-state memory 110 and a second operating mode having a second number of quantization levels to determine the value stored in the at least one cell. In a particular embodiment, the first number of quantization levels can match a number of possible values represented by the at least one cell, and the second number of quantization levels is greater than the first number of quantization levels. In a particular example, the second number of quantization levels is an even multiple of the first number of quantization levels. In another particular example, the second number of quantization levels is two times the first number of quantization levels. In a particular example, the operating mode of the ADC 122 may selectively enable the first operating mode or the second operating mode as a selected operating mode and determine a signal representative of the value stored in the at least one cell using the selected operating mode. In a particular example, the ADC 122 may enable the second operating mode in response to detection of data errors, where the second operating mode provides greater granularity (more quantization levels), which granularity can be used to determine the signal. In a particular example, the second number of quantization levels can be exploited to perform a deeper error recovery process. In another particular embodiment, the second operating mode can be enabled when a number of data errors exceeds an error threshold, which may be determined by an error correction capacity of an associated decoder.

In this particular example, since the data bandwidth through the interface 112 from the host system 104 to the solid-state memory 110 can limit performance of the storage device 102, the storage device 102 can optionally operate in a traditional mode of using the ADC 122 that matches the levels being decoded. For example, with single level cell (SLC), a single bit comparator can be used. However, if the storage device 102 detects a data error that is otherwise unrecoverable, the storage device 102 can selectively activate the ADC to utilize the higher resolution mode (which can utilize more bus bandwidth), allowing the higher resolution ADC 122 to quantize the data with a greater number of quantization levels to allow the read/write channel decoder 118 to perform a deeper error recovery to correct the errors. In a particular example, the ADC 122 can operate in a first mode to quantize the data at a resolution (i.e., with a number of quantization levels) that is equal to the number of bits represented by the cell, and can selectively operate in a second mode that has a higher resolution (i.e., a greater number of quantization levels than the number of bits represented by the cell) when a detected data error exceeds an error threshold. In a particular example, the first operating mode may consume less power than the second operating mode, and the mode of operation can be selected based on a power mode associated with a host system. For example, if the host system is in a reduced power mode (such as a sleep mode, an idle mode, another low-power mode, or any combination thereof), the ADC 122 can operate in a first operating mode to conserve power.

While leakage rates will vary somewhat from cell to cell within the array due, for example, due to physical defects near the oxide barriers, the leakage trends may be shared by cells within a particular sector of the solid-state storage media because the cells in the particular sector are programmed at the same time. Further, repeated Program/Erase cycling can cause accumulation of trapped charge in the gate oxide of the cells, resulting in a threshold shift, which can also affect leakage rates. Each time a cell is read from the solid-state storage media 124, a small amount of charge is deposited, such that, over time, sectors can experience degradation due to the charge accumulation, resulting in read errors. Since each of the cells of a given sector of the solid-state storage media 124 experiences the same Program/Erase history, particular sectors of the solid-state storage media 124 can experience an average threshold shift that can be seen to some degree by all cells in the sector. These are just two examples of the type of correlated shift is easily dealt with by the read/write channel decoder 118 or other adaptive decoders, such as a soft-output trellis decoder, an iterative turbo decoder, a Viterbi decoder, a Reed-Solomon iterative decoder, a low-density parity check (LDPC) decoder, other types of decoders, or any combination thereof.

Further, the solid-state storage media 124 can experience cell-specific errors that can be caused by localized cell characteristics and defects. Other error sources include adjacent cell/read pattern sensitivity. Both cell-specific errors and adjacent cell/read pattern sensitivity can be viewed as random Gaussian noise, which can be readily handled by the read/write channel decoder 118.

It should be understood that the above-identified error sources are illustrative only, and that errors may be introduced from other sources as well. Further, it should be understood that the types of noise, such as random Gaussian noise, are discussed for illustrative purposes and that data errors corrected by the read/write channel decoder 118 may or may not stem from random Gaussian noise.

In a particular embodiment, the ADC 122 is selected to have a resolution (i.e., a number of quantization levels) that is greater than a number of possible bit values represented by a particular cell, allowing the ADC 122 to provide an output signal having a relatively high granularity (as compared to ADCs that have a resolution that matches the number of possible bit values of a given cell) that can be used by the read/write channel decoder 118 to resolve cell-specific, adjacent cell/read pattern sensitivity, and trapped charge errors to provide a corrected output signal to the formatter 116. In a particular example, the read/write channel decoder 118 receives a serial digital data stream generated by one or more external A/D Flash chips (i.e., from the solid-state memory 110). The data stream can include sequential data samples from at least one ADC 122 associated with a particular cell or group of cells.

Figure 2A:
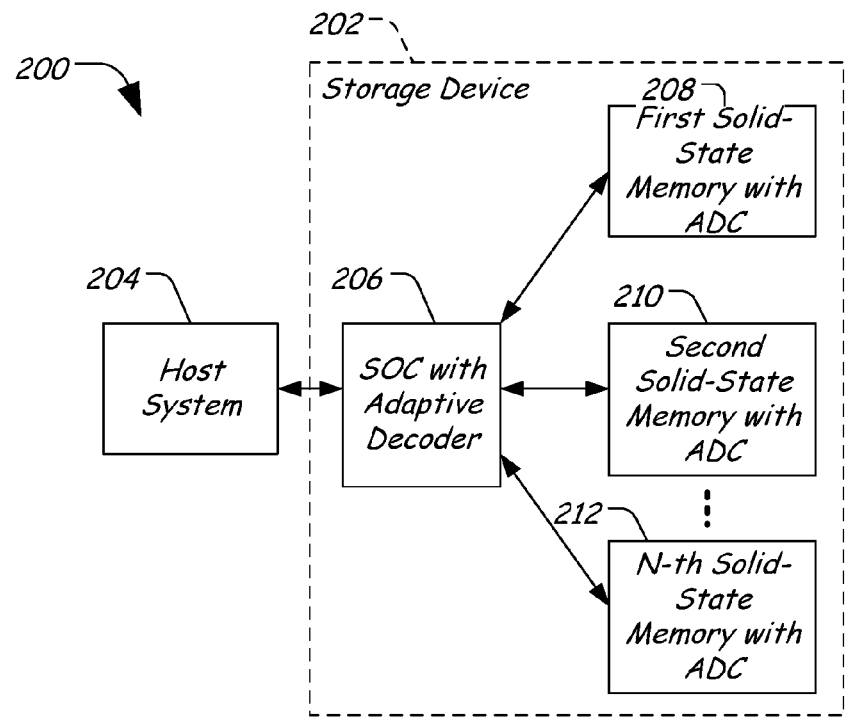
FIG. 2A is a block diagram of a particular illustrative embodiment of a system including a channel decoder coupled to a plurality of solid-state storage media via a star topology.

FIG. 2A is a block diagram of a particular illustrative embodiment of a system 200 including a channel decoder coupled to a plurality of ADC solid-state storage media, such as the first, second, and n-th solid-state memories 208, 210, and 212, via a star topology. The system 200 includes a storage device 202 that is adapted to communicate with a host system 204. The storage device 202 includes a system on a chip (SOC) with a channel decoder 206 that is coupled to the first solid-state memory 208, the second solid-state memory 210, and the n-th solid-state memory 212. Each of the first, second, and n-th solid state memories 208, 210, and 212 includes a relatively high-resolution analog-to-digital converter (ADC) having a greater number of quantized levels than a given cell or group of cells has possible bit values within the respective solid-state memories 208, 210, and 212 has possible bit values. While only three solid-state memories 208, 210, and 212 are shown, it should be understood that any number of solid-state memories 208, 210, and 212 can be coupled to the channel decoder 206.

Figure 2B:
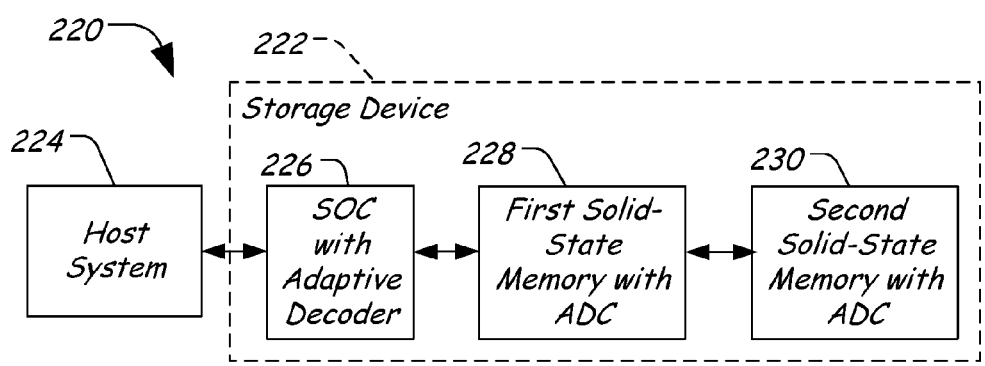
FIG. 2B is a block diagram of a particular illustrative embodiment of a system including a channel decoder coupled to a plurality of solid-state storage media via a daisy-chain configuration.

FIG. 2B is a block diagram of a particular illustrative embodiment of a system 220 including a channel decoder coupled to a plurality of ADC solid-state storage media via a daisy-chain configuration. The system 220 includes a storage device 222 that is coupled to a host system 224. The storage device 222 includes a system on a chip (SOC) 226 that is coupled to a first solid-state memory 228 and is coupled to a second solid-state memory 230 via the first solid-state memory 228. In this particular example, the read/write channel decoder of the SOC 226 can interpolate a value based on the high resolution ADC output of the first solid-state memory 228, the second solid-state memory 230, or any combination thereof.

In the systems 200 and 220 illustrated in FIGS. 2A and 2B, the SOCs 206 and 226 include channel decoders that are adaptive and that can receive data from multiple solid-state memories, such as the solid-state memories 208, 210, and 212 and the solid-state memories 228 and 230. The channel decoders of the SOCs 206 and 226 are adapted to take advantage of the relatively high resolution outputs from the ADCs of the solid-state memories to correct errors within the received data. In a particular example, the ADCs of the solid-state memories have resolutions that are greater than a number of bits represented by an associated portion of the solid-state storage media. In a particular example, the ADCs can have a resolution that is two or more times the number of bits represented by the associated portion of the solid-state storage media.

While wear-leveling and other techniques have been used to ensure that no single sector wears out before another in an attempt to provide graceful (relatively consistent) system capacity degradation over time, such wear-leveling techniques tend to be based on the number of program erase cycles. However, by using a higher resolution ADC and by providing the output (i.e., a quantized value) of the ADC directly to the adaptive decoder of the SOC, instead of just basing wear-leveling on the number of program erase cycles, a quality metric can be derived from the error data to determine storage device capacity degradation. In a particular example, the SOCs 206 and 226 are adapted to determine a relative state space distance measure between a final (corrected) word from the channel decoder of the SOCs 206 or 226 and the original data from the ADC of the particular solid-state memory. Further, the distance can be based directly upon the output of the channel or the output any additional ECC correcting codes.

In a particular example, the SOCs 206 and 226 can compare the determined distance to a distance threshold, and can cease use of bad sectors preemptively, when the determined distance exceeds the distance threshold. Thus, as the storage media wears through usage, read errors become more pronounced, and the SOCs 206 and 226 can include logic to determine when the distance exceeds the distance threshold. As compared to traditional Flash memory devices having a course quantization, the addition of a higher resolution ADC (i.e., an ADC having a resolution that is greater than a number of bits per memory cell) provides a more precise charge measurement and a distance between the corrected data and the quantization provides a more accurate indicator of the health of a sector. In a particular example, logic circuitry (such as the SOCs 206 and 226) is adapted to determine a quality metric associated with at least one portion of the solid-state data storage media, such as the solid-state memories 208, 210, and 212 and the solid-state memories 228 and 230, when a quantized charge determined by the ADCs of the SOCs 206 and 208 fall below a threshold charge level. In another particular example, the logic circuit is adapted to determine a quality metric associated with a storage capacity of a portion of the solid-state data storage media, such as the solid-state memories 208, 210, and 212 and the solid-state memories 228 and 230, based on a distance between the determined signal (i.e., the read data) and the corrected output signal. In a particular embodiment, the SOCs 206 and 208 include logic to determine the health of the particular sector from a measured charge level quantized by the ADCs. In a particular example, the logic of the SOCs 206 and 208 is adapted to identify or mark a sector of the plurality of solid-state memories 208, 210, 212, 228 and 230 as unusable when the charge level reaches a threshold charge level. In another particular example, the health of the particular sector can be a quality metric associated with a correctable error threshold, which defines a charge level (such as a gate charge level) below which a data error may be uncorrectable. In this example, the correctable error threshold is reached when a measured charge level quantized by the ADC falls below a charge threshold.

Further, one technique for wear leveling includes setting all cells to a fully programmed state before erasing the cells; however, the extra programming "wear" from the additional write operation can be detrimental to the overall lifetime of the flash memory. However, with higher resolution ADC and the associated SOCs 206 and 226 with channel decoders, there can be an improvement in usable cell life, in part, because balanced wear that causes charge threshold shifts and other errors can be corrected by the channel decoder. Alternatively, the data patterns written to the array can be pre-encoded with an encoding scheme that more uniformly distributes "1" and "0" so cells experience similar programming histories, but the higher resolution ADC and the associated SOCs 206 and 226 are adapted to overcome Gaussian-type noise and other correlated errors that may be consistent with such common programming histories. In a particular embodiment, the flash memories can apply adjustable gain control techniques with re-try logic to the higher resolution ADCs to improve dynamic range in cases where the channel decoder of the SOC 206 or 226 fails to initially converge or fails to generate a high confidence decoded result.

In a particular embodiment, by directly measuring actual charge levels of the solid-state memory using the higher resolution ADC (i.e., an ADC having a higher resolution (i.e., more quantized levels) than a number of possible bits values stored in each cell of the solid-state memory), the health of a sector of the solid-state memory can be determined reliably, thereby increasing the longevity of the data storage and reducing the probability of an uncorrectable multi-bit error. While conventional solid-state memory can produce uncorrectable errors when the solid-state memory is left dormant for a long period of time, the adaptive decoder of the SOC 206 or 226 in conjunction with the higher resolution ADC of the solid-state memories can stretch out the recovery time as the signal to noise ratio decreases, and can provide much greater latitude in terms of charge accumulation (threshold shift) or other errors before data becomes unrecoverable.

In a particular example, the solid-state memory uses a high resolution ADC that can include individual A/D converters to replace sense amplifiers with a ten percent (10%) increase in die size. Further, other conversions techniques are possible including those that modulate the gate voltage in conjunction with single output comparator and state machine. In a particular example, the results of the error correction by the channel decoder of the SOCs can be used to modulate the gate voltages.

In a particular illustrative example, it may be advantageous to reorganize the array to read data sequentially from a NAND string, which reorganization can increase the common drift, aging, and usage history commonality of the cells of the array. While reading data in this particular fashion could be slower, an intelligent controller can initiate multiple reads in parallel to maintain aggregate throughput. In this example, instead of serial communication protocols, the communication protocol between the solid-state storage device and the SOC can use protocols that support out-of-order split transactions. The state machine would guarantee maximum read latency.

Figure 3:
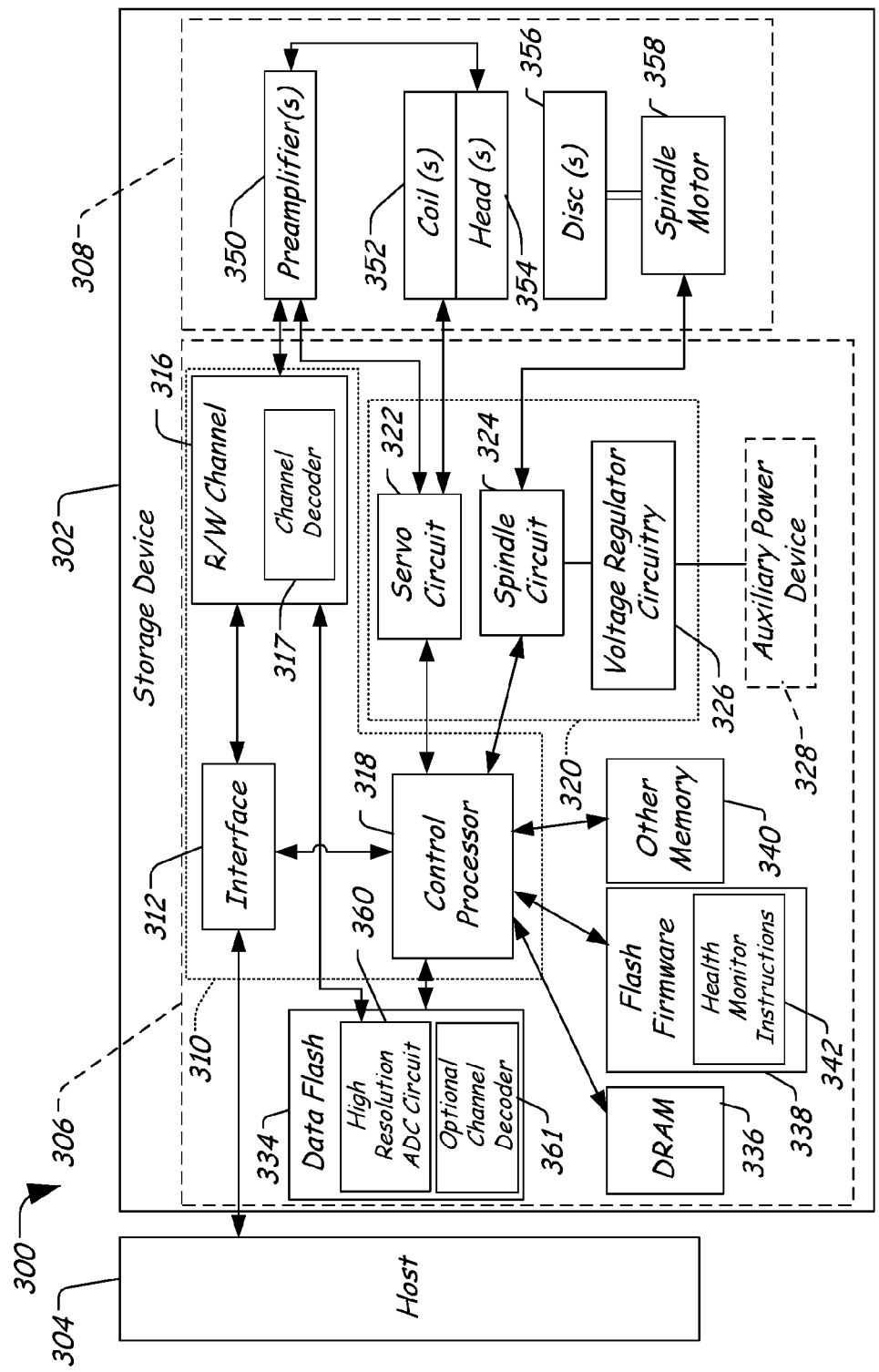
FIG. 3 is a block diagram of a particular illustrative embodiment of a system including a hybrid storage device including a disc storage media and a solid-state storage media with a high resolution ADC circuit coupled to a channel decoder of a read/write channel.

FIG. 3 is a block diagram of a second particular illustrative embodiment of a system 300 including a hybrid storage device 302 having a controller (i.e., a control processor 318) to store data to and retrieve data from at least one of a first storage media and a second storage media. The hybrid storage device 302 includes both disc storage media (one or more discs 356) and solid-state storage media, such as a flash memory device (data flash 334, flash firmware 338, etc.). The hybrid storage device 302 is adapted to communicate with a host system 304. In a particular embodiment, the host system 304 can be a computer, a processor, a personal digital assistant (PDA), another electronic device, or any combination thereof. In a particular example, the hybrid storage device 302 can communicate with the host system 304 via a universal serial bus (USB), another type of communication interface, or any combination thereof. In another particular example, the hybrid storage device 302 can be a stand-alone device that is adapted to communicate with the host system 304 via a network, such as via a network cable using a networking protocol.

The hybrid storage device 302 includes recording subsystem circuitry 306 and a head-disc assembly 308. The recording subsystem circuitry 306 includes storage device read/write control circuitry 310 and disc-head assembly control circuitry 320. The recording subsystem circuitry 306 further includes an interface circuit 312, which includes a data buffer for temporarily buffering data received via the interface circuit 312 and which includes a sequencer for directing the operation of the read/write channel 316 and the preamplifier 350 during data transfer operations. The interface circuit 312 is coupled to the host system 304 and to a control processor 318, which is adapted to control operation of the hybrid storage device 302.

The control processor 318 is coupled to a servo circuit 322 that is adapted to control the position of one or more read/write heads 354 relative to one or more discs 356 as part of a servo loop established by the one or more read/write heads 354. The one or more read/write heads 354 can be mounted to a rotary actuator assembly to which a coil 352 of a voice coil motor (VCM) is attached. The VCM includes a pair of magnetic flux paths between which the coil 352 is disposed so that the passage of current through the coil 352 causes magnetic interaction between the coil 352 and the magnetic flux paths, resulting in the controlled rotation of the actuator assembly and the movement of the one or more heads 354 relative to the surfaces of the one or more discs 356. In a particular embodiment, the one or more discs 356 represent rotatable, non-volatile storage media adapted to store data, compiled applications, other information, or any combination thereof. The servo circuit 322 is used to control the application of current to the coil 352, and hence the position of the heads 354 with respect to the tracks of the one or more discs 356.

The disc-head assembly control circuitry 320 includes the servo circuit 322 and includes a spindle circuit 324 that is coupled to a spindle motor 358 to control the rotation of the one or more discs 356. The hybrid storage device 302 also includes an auxiliary power device 328 that is coupled to voltage regulator circuitry 326 of the disc-head assembly control circuitry 320 and that is adapted to operate as a power source when power to the hybrid storage device 302 is lost. In a particular embodiment, the auxiliary power device 328 can be a capacitor or a battery that is adapted to supply power to the hybrid storage device 302 under certain operating conditions. In a particular example, the auxiliary power device 328 can provide a power supply to the recording subsystem assembly 306 and to the disc-head assembly 308 to record data to the one or more discs 356 when power is turned off. Further, the auxiliary power device 328 may supply power to the recording subsystem assembly 306 to record data to the data flash 334 when power is reduced.

Additionally, the hybrid storage device 302 includes the data flash memory 334, a dynamic random access memory (DRAM) 336, firmware 338 (such as a flash memory), other memory 342, or any combination thereof. In a particular embodiment, the firmware 338 is accessible to the control processor 318 and is adapted to store instructions that can be executed by the control processor 318.

In a particular embodiment, the data flash 334 includes an analog-to-digital converter (ADC) circuit 360 that has a resolution that is greater than (i.e., a greater number of quantization levels) a resolution of the particular cells (i.e., a number of possible bit values that can be represented by the particular cells) of the data flash 334. For example, if a particular cell of the data flash 334 is adapted to represent three data bits, the ADC circuit 360 has a resolution that is greater than three bits (i.e., has more than eight quantization levels, e.g., $2^3$ bits). Further, the ADC circuit 360 is coupled to the read-write channel 316, which includes a channel decoder 317, to utilize the existing adaptive decoder to determine the data values based on an output of the high resolution ADC circuit 360. Further, the flash firmware 338 includes health monitor instructions 342 that are executable by the control processor 318 to derive a quality metric based on a distance between a corrected output from the channel decoder 317 and an output of the ADC circuit 360, where the distance provides an indication of a relative health of the data flash 334. In a particular example, the relative health can be an indication of storage capacity degradation of the data flash 334.

In a particular embodiment, the data flash 334 can incorporate both a high resolution ADC 360 and an optional channel decoder 361. Further, in a particular example, the high resolution ADC 360 may be selectively activated by the control processor 318 based on data errors to provide a deep error recovery mode, when data errors exceed a particular threshold. During operation, the data flash 334 can operate in a first ADC mode that uses an ADC having a resolution that matches the levels being decoded. For example, with Single Level Cell (SLC), a single bit comparator can be used. However if the control processor 318 detects a data error that is otherwise unrecoverable, the control processor 318 can selectively activate a higher resolution ADC mode (which can utilize more bus bandwidth), allowing the higher resolution ADC 360 to quantize the data with greater resolution and to provide the higher resolution output to channel decoder 317 or to the optional channel decoder 361 to perform a deeper error recovery to correct the errors.

In a particular embodiment, the ADC 360 can operate in a first operating mode that quantizes data at a resolution that matches the number of bits represented by a particular cell and can operate in a second operating mode that quantizes the data at a higher resolution when a detected data error exceeds an error threshold. In a particular example, in response to detecting a data error that exceeds error correction capabilities in the first operating mode, the control processor 318 is adapted to activate the second operating mode of the ADC 360 to initiate a deeper error recovery to correct the errors.

Figure 4:
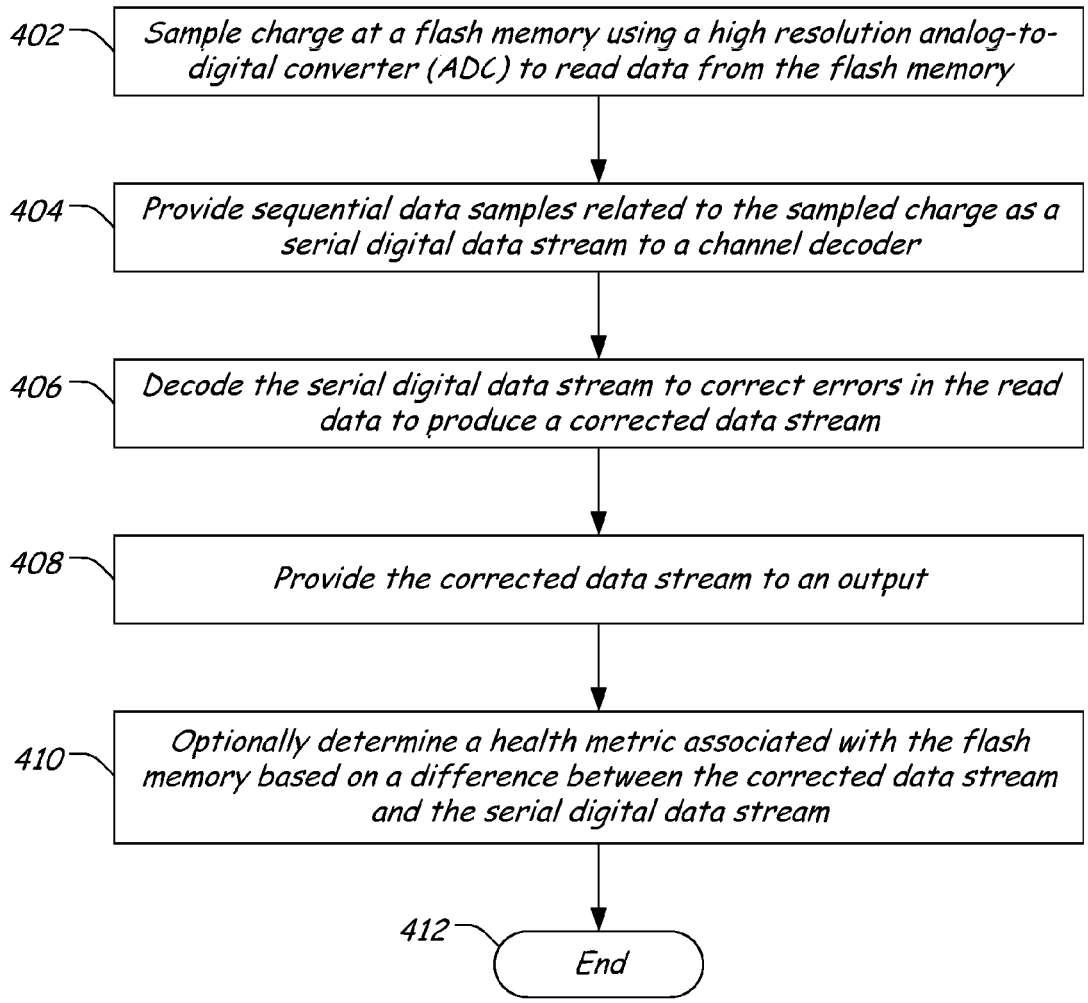
FIG. 4 is a flow diagram of a particular illustrative embodiment of a method of retrieving data from a solid-state storage media

FIG. 4 is a flow diagram of a particular illustrative embodiment of a method of retrieving data from a solid-state storage media. At 402, a charge is sampled at a flash memory using a high resolution analog-to-digital converter (ADC) to read from the flash memory. In a particular example, the resolution of the ADC may be high relative to ADCs that have a resolution that matches the number of bits represented by a particular memory cell of the solid-state storage media. In a particular embodiment, the high resolution ADC has a resolution (i.e., a number quantization levels) that is two or more times a number of possible bit values represented by a particular memory cell. Moving to 404, sequential data samples related to the sampled charge is provided to a channel decoder as a serial digital data stream. Continuing to 406, the serial digital data stream is decoded to correct errors in the read data to produce a correlated data stream. In a particular example, the digital data stream is decoded using a channel decoder, which can be an adaptive decoder such as a Low-Density Parity-Check (LDPC) decoder, a Reed-Solomon decoder, an iterative decoder, a turbo decoder, a Soft-Output Viterbi-Algorithm (SOVA) decoder, another type of adaptive decoder, or any combination thereof. Advancing to 408, the corrected data stream is provided to an output.

Proceeding to 410, a health metric associated with the flash memory is optionally determined based on a difference between the corrected data stream and the serial digital data stream. In a particular embodiment, a controller determines a health metric associated with a storage media, a sector of the storage media, a cell of the storage media, or any combination thereof. In a particular example, the health metric can be based on a distance or difference between the corrected output and the serial digital data stream. In another particular embodiment, the controller is adapted to generate an alert, mark the identified storage media, sector, or cell as being bad, alter memory allocation patterns, take other actions to prevent loss of data, or any combination thereof. The method terminates at 412.

In conjunction with the systems and method disclosed above with respect to FIGS. 1-4, a storage device is provided that includes a solid-state storage media including a plurality of cells adapted to represent data. The storage device further includes an analog-to-digital converter (ADC) coupled to at least one cell of the plurality of cells and adapted to quantize a gate charge stored at the at least one cell to a signal that represents bit values associated with the at least one cell. The ADC has a resolution (i.e., a number of quantization levels) that is greater than a number of possible bit values represented by the at least one cell. In a particular embodiment, one or more ADCs can be included within the solid-state storage media device. The storage device also includes an adaptive decoder coupled to the ADC (or the one or more ADCs) and adapted to decode the signal to produce an output signal. Further, the storage device can include logic adapted to determine a health metric associated with the solid-state storage media based on a distance (difference) between an output from the ADC and a corrected output from the adaptive decoder.

In a particular embodiment, the adaptive decoder takes advantage of correlated errors between roughly adjacent storage cells of the solid-state storage media to correct data errors. Further, since adjacent cells of the solid-state storage media experience similar program/erase cycling, charge retention resulting in threshold shifts and physical defects that cause data errors can be treated as Gaussian noise that can be decoded by the channel decoder. Thus, the useful life of the solid-state storage media can be enhanced, and the overall performance of the storage media can be improved.

While the embodiments described above with respect to FIGS. 1 and 2 illustrate an analog-to-digital converter (ADC) associated with the solid-state memory, such as a flash memory, and a host system including error processing control. However, in a particular embodiment, the error processing (channel decoding) control can be included within the solid-state memory, providing a relatively high resolution quantization of the stored charge and a built-in error correction feature that can decode the stored data before providing the data to a controller of the storage device. By incorporating the channel decoding (error correction) functionality within the solid-state memory, memory-specific decoding functionality can be incorporated that can enhance reliability and performance of the solid-state memory.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the storage system while maintaining substantially the same functionality without departing from the scope and spirit of the present invention. In addition, although the preferred embodiment described herein is directed to a data storage system including a flash memory with a high resolution analog-to-digital converter (ADC), it will be appreciated by those skilled in the art that the teachings of the present invention can be applied to other solid-state storage media, without departing from the scope and spirit of the present invention.

What is claimed is:

1. A storage device comprising:
    a storage medium including a plurality of cells configured to store data;
    an analog-to-digital converter (ADC) coupled to at least one cell of the plurality of cells, the ADC including:
        a first operating mode having a first number of quantization levels to determine a value stored in the at least one cell;
        a second operating mode having a second number of quantization levels to determine the value stored in the at least one cell, wherein the second number of quantization levels is greater than the first number of quantization levels; and
    a controller, coupled to the ADC, configured to activate the second operating mode of the ADC in response to an error event that results in a failure to determine the value stored in the at least one cell in the first operating mode.

2. The storage device of claim 1, wherein the first number of quantization levels matches a number of possible values represented by the at least one cell.

3. The storage device of claim 1, wherein the ADC is configured to determine a signal representative of the value stored in the at least one cell using either the first operating mode or the second operating mode.

4. The storage device of claim 3, wherein the signal representative of the value stored in the at least one cell comprises a gate charge that is quantized by the ADC to represent bit values.

5. The storage device of claim 1, wherein the controller is further configured to detect data errors, the controller including logic to activate the second operating mode when a number of data errors exceeds an error threshold, the number of data errors exceeding the error threshold being the error event.

6. The storage device of claim 5, further comprising a decoder coupled to the ADC and adapted to correct data errors based on the signal, wherein the error threshold comprises a number of errors that can be corrected by the decoder.

7. The storage device of claim 6, wherein the decoder comprises at least one of a Reed-Solomon iterative decoder, an iterative turbo decoder, and a low-density parity check (LDPC) decoder.

8. The storage device of claim 6, wherein the decoder is adapted to decode the signal to overcome a local correlation of error disturbances between cells of the plurality of cells.

9. The storage device of claim 1, wherein the second number of quantization levels is at least twice a number of possible values associated with the at least one cell.

10. The storage device of claim 1, wherein the ADC receives a first power level when operating in the first operating mode and a second power level when operating in the second operating mode, wherein the first power level is less than the second power level.

11. The storage device of claim 1, wherein the second number of quantization levels comprises an even multiple of the first number of quantization levels.

12. A storage device comprising:
    an analog-to-digital converter (ADC) having a plurality of operating modes with each of the plurality of operating modes having a different number of quantization levels to determine a value stored in a data cell, wherein operation of the ADC is alterable from a lower quantization level operating mode of the plurality of operating modes to a higher quantization level operating mode of the plurality of operating modes in response to an error event that results in a failure to determine the value stored in the data cell in the lower quantization level operating mode.

13. The storage device of claim 12, wherein the ADC is configured to receive a first power level when operating in the lower quantization level operating mode and configured to receive a second power level when operating in the higher quantization level operating mode, wherein the first power level is less than the second power level.

14. A storage device comprising:
    a solid-state data storage medium including at least one cell configured to represent data;
    an analog-to-digital converter (ADC) coupled to the at least one cell of the solid-state data storage medium and configured to determine a signal representing data that is stored at the at least one cell, the ADC having a plurality of operating modes, with each of the plurality of operating modes having a different resolution level to determine the signal representing the data that is stored in the at least one cell;
    a decoder configured to correct errors in the determined signal and to responsively produce an output signal; and
    a controller, coupled to the ADC, configured to activate a higher resolution level operating mode of the plurality of operating modes in response to a failure of the decoder to correct the errors in the determined signal in a lower level operating mode of the plurality of operating modes.

15. The storage device of claim 14, wherein the signal representing data is determined by determining a charge associated with the at least one cell via the ADC.

16. The storage device of claim 14, further comprising:
    a rotatable data storage medium; and wherein the decoder is coupled to a read/write channel associated with the rotatable data storage medium and is configured to decode data read from the solid-state data storage medium and data read from the rotatable data storage medium.

17. The storage device of claim 14, wherein the ADC is included within the solid-state data storage medium.

18. The storage device of claim 14, further comprising:
logic circuitry adapted to determine a quality metric associated with a storage capacity of a portion of the solid-state data storage medium based on a difference between the determined signal and the output signal;
wherein the difference represents errors in the determined signal due to degradation of the solid-state data storage medium; and
wherein the logic circuitry is adapted to identify a portion of the solid-state data storage medium as unusable when the difference exceeds a difference threshold.

19. The storage device of claim 18, wherein the difference threshold relates to a number of read errors that exceed an error correction capacity of the decoder.

20. The storage device of claim 14, wherein the decoder comprises at least one of a Reed-Solomon iterative decoder, an iterative turbo decoder, and a low-density parity check (LDPC) decoder.

21. The storage device of claim 14, wherein the ADC is configured to receive a first power level when operating in the lower resolution level operating mode and configured to receive a second power level when operating in the higher resolution level operating mode, wherein the first power level is less than the second power level.

* * * * *